United States Patent
Iroaga et al.

(10) Patent No.: US 7,369,080 B1
(45) Date of Patent: May 6, 2008

(54) METHOD AND SYSTEM FOR DRIVER CIRCUITS OF CAPACITIVE LOADS

(75) Inventors: Echere Iroaga, Mountain View, CA (US); Boris Murmann, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/521,077

(22) Filed: Sep. 14, 2006

(51) Int. Cl.
*H03M 1/12* (2006.01)
(52) U.S. Cl. .................. 341/172; 341/161; 320/166
(58) Field of Classification Search ............... 341/161, 341/162, 163, 172; 320/166
See application file for complete search history.

(56) References Cited

U.S. PATENT DOCUMENTS 3,633,197 A * 1/1972 Dunlap, III .................. 28/299
5,572,107 A * 11/1996 Koch et al. ................ 320/166
5,850,337 A * 12/1998 Lee ............................ 363/62

OTHER PUBLICATIONS

Boris Murmann and Bernhard E. Boser. "A 12-bit 75-MS/s Pipelined ADC Using Open-Loop Residue Amplification." *IEEE Journal of Solid State Circuits* (Dec. 2003). vol. 38, No. 12, pp. 2040-2050.
Echere Iroaga and Boris Murmann. "A 12b 75MS/s Pipelined ADC Using Imcomplete Settling." *VLSI Circuit, 2006. Digest of Technical Papers*. Jun. 15-17, 2006, pp. 222-223.

* cited by examiner

*Primary Examiner*—Howard Williams
(74) *Attorney, Agent, or Firm*—Crawford Maunu PLLC

(57) ABSTRACT

Driver circuits for switched-capacitor circuits are implemented using a variety of methods and devices. According to one such circuit, a switched-capacitor driver circuit is implemented for producing an output signal by driving a capacitive output load in response to step input signals. The driver circuit includes output circuitry that drives the capacitive output load toward a steady-state mode responsive to one of the step input signals and control circuitry that, before realizing the steady-state mode, inhibits the output circuitry from driving the capacitive output load to the steady-state mode.

44 Claims, 8 Drawing Sheets

METHOD AND SYSTEM FOR DRIVER CIRCUITS OF CAPACITIVE LOADS

FIELD OF THE INVENTION

The present invention relates generally to systems and approaches for driver circuits, and more particularly to driver circuits for switched-capacitor circuits.

BACKGROUND

Many circuits drive a capacitive load in response to an input signal. Often the circuits are designed to drive the capacitive load to a certain charge or voltage while in a drive mode. Once the capacitive load reaches the charge or voltage the circuit enters a mode where the charge or voltage is maintained. Such a mode is sometimes referred to as the steady-state mode because the charge or voltage is essentially constant. In many such circuits it is desirable that the voltage or charge on the capacitive load accurately represent the steady-state mode. For instance, one such drive circuit is an amplifier circuit in which the charge or voltage at the steady-state mode represents an amplified input signal.

After the circuit begins to drive the capacitive load, the time necessary to guarantee that the circuit has reached a steady-state mode is sometimes referred to as the settling time. This time is relevant to both the speed of the circuit and the power dissipation of the device. In some applications the settling time can be reduced by increasing the drive strength of the circuit, however, this can result in increased power dissipation and can also cause ringing of the charge or voltage on the load. As devices decrease in size (e.g., portable devices) and increase in accuracy, the competing desires for increased accuracy and decreased power dissipation become more difficult to accomplish.

Particular examples of driver circuits are used in switched-capacitor circuits, such as analog to digital converters (ADCs). Two specific examples of ADCs are cyclic and pipeline, both of which have a first stage that produces a digital representation of the step input signal having a certain amount of precision. This digital representation is converted back to an analog signal and subtracted from the original input signal. The resulting signal represents a portion of the signal that was not accounted for by the precision of the digital representation. The resulting signal is applied to a driver circuit that often acts as an amplifier. The driver circuit drives a capacitive load that can be used to generate a digital representation having a higher amount of precision relative to the first amount of precision. In a cyclic ADC, the capacitive load is used as an input to the original ADC stage. In a pipeline ADC, the capacitive load is used as an input to a second ADC stage. For either type of ADC, the process can be repeated until the desired precision is obtained.

ADCs have increasing need for increased performance and reduced power dissipation as applications become both more complex and smaller in size. Because the output of the first stage can be amplified many times, errors in the first stage are also amplified. Thus, current applications using ADCs allow the driver circuit sufficient active time in order to guarantee that the driver circuit has reached the steady-state mode. Moreover, in order to reduce the settling time, ADCs use strong driver circuits that require large amounts of power. One reason for using strong driver circuits is that it is often undesirable to decrease the capacitive load as the decrease can result in increased errors due to process variations and electronic noise.

These and other issues have presented challenges to the implementation and design of driver circuits, including those involving switched-capacitor circuits and similar applications. Accordingly, there is a need for a capacitive drive circuit that provides increased accuracy or reduced power consumption.

SUMMARY

The claimed invention is directed to driver circuits and methods for switched-capacitor circuits. The present invention is exemplified in a number of implementations and applications, some of which are summarized below.

Various example embodiments of the present invention are directed to a switched-capacitor driver circuit for producing an output signal by driving a capacitive output load in response to step input signals. The driver circuit includes output circuitry that drives the capacitive output load toward a steady-state mode responsive to one of the step input signals and control circuitry that, before realizing the steady-state mode, inhibits the output circuitry from driving the capacitive output load to the steady-state mode.

Another embodiment of the present invention, for use in a switched-capacitor circuit, is directed to a method to produce an output signal by driving a capacitive output load in response to step input signals. The method includes driving the capacitive output load toward steady state modes in response to the step input signals using a current through driver circuitry and inhibiting the driving of the capacitive output load to the steady-state modes prior to reaching the steady-state modes.

In another embodiment of the present invention, for use in a stage of one of a cyclic and pipelined analog-to-digital converter, a driver circuit is implemented to produce an output signal by driving a capacitive output load in response to step input signals. The driver circuit includes output circuitry that drives the capacitive output load toward a steady-state mode in response to one of the step input signals and control circuitry that, before realizing the steady-state mode, inhibits the output circuitry from driving the capacitive output load to the steady-state mode.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings, in which.

Figure 1:
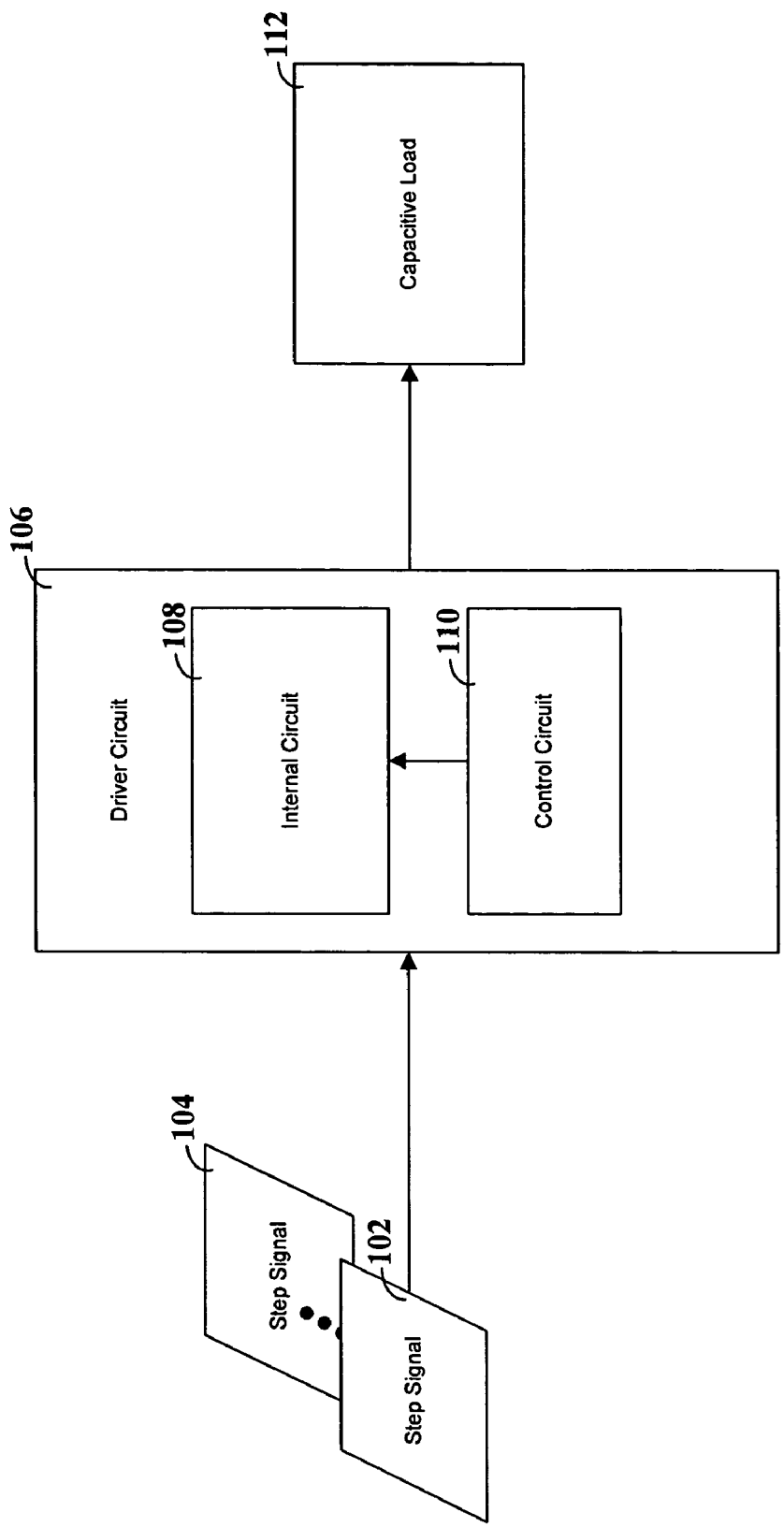
FIG. 1 shows a block diagram of a driver system, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be useful for a variety of different switched-capacitor driver applications, and the invention has been found to be particularly suited for use with pipelined and cyclic ADC arrangements and methods. While the present invention is not necessarily limited to such applications, various aspects of the invention may be appreciated through a discussion of various examples using this context.

Consistent with one example embodiment of the present invention, a driver circuit is used in a switched-capacitor circuit. Switched-capacitor circuits are circuits in which a capacitive load is driven to a charge or voltage level in response to a step input. The driver circuit drives a capacitive output load in response to step input signals using internal circuitry. The driver circuit drives the capacitive output load toward a steady-state mode for each step input signal. The driver circuit also has control circuitry that inhibits the driving operation of the driver circuit such that the driver circuit does not reach the steady-state mode, thereby introducing an error relative to the steady-state mode. This is particularly useful for reducing one or more of the active time of the driver circuit and the power consumption of the driver circuit.

Consistent with another example embodiment of the present invention, the introduced error is compensated for using a digital approximation of the error. In one instance, the approximation is a function of the driver circuit, the capacitive output load and the control circuitry. This approximation can be used in conjunction with the actual voltage or charge on the load to estimate the amount of charge or voltage that corresponds to the steady-state mode.

Consistent with another example embodiment of the present invention, the charge or voltage on the capacitive load is then used as an input for further processing. By inhibiting the driving of the output load before it reaches steady-state mode, a number of changes can be made to the driver circuit. In one instance, the driver circuit can be implemented using slower driver characteristics. This can be particularly useful for reducing the power consumption of the driver circuit as well as the cost of the driver circuit. In another instance, the driver circuit can be implemented such that the driver circuit is inactive a larger percentage of the time between consecutive step input signals. This can be particularly useful for reducing power dissipation of the driver circuit by reducing the active time of the driver circuit. In yet another instance, the driver circuit can be implemented such that the amount of time between consecutive step input signals is reduced. This can be particularly useful for increasing the throughput of the circuit.

Consistent with another example embodiment of the present invention, the driver circuit is used for one of a pipeline ADC or a cyclic ADC. The implementation can be particularly useful for implementing an ADC having reduced power dissipation or for implementing an ADC having a higher throughput.

Turning now to the figures, FIG. 1 shows a block diagram of a driver system, according to an example embodiment of the present invention. The diagram shows step signals 102-104 as inputs to driver circuit 106, which drives capacitive load 112. Driver circuit 106 includes internal circuit 108 and control circuit 110.

Step signals 102-104 provide consecutive inputs to driver circuit 106. Driver circuit 106 produces outputs that correspond to the step signals by driving capacitive load 112 towards steady-state modes. In a particular embodiment of the present invention, the driver circuit 106 operates as an amplifier of step signals 102-104. Internal circuit 108 controls the output to capacitive load 112 using an internal current. Control circuit 110 inhibits the output of internal circuit 108 prior to reaching the steady-state mode. As the system does not reach the steady-state mode, the capacitive load does not reach the voltage or charge associated with the steady-state mode. In one instance, the difference between the actual voltage or charge and the steady-state mode voltage or charge can be viewed as an error. For instance, where the internal circuit 108 functions as an amplifier of step signals 102-104, the steady-state mode represents the desired gain of the amplifier relative to the step signals 102-104. The actual charge or voltage on load 112 does not reach the steady-state charge, creating a corresponding error. In another instance, the driver circuit 106 can be arranged such that the gain of the amplifier is greater than the desired output. Thus, the output charge or voltage that corresponds to the steady-state mode includes an error from the desired output. In one instance, the error from the desired output is such that the driver circuit 106 necessarily drives the output load to the desired output prior to reaching the steady-state mode. Thus, the driver circuit can produce the desired output signal by preventing the driver circuit 106 from reaching the steady-state mode.

In one embodiment of the present invention, control circuit 110 inhibits driver circuit 106 in response to a time delay derived from the capacitive load and driver characteristics of internal circuit 108. For example, the RC constant of a load and driver is sometimes referred to as the tau (τ) time constant and is relevant to the time required to charge the load. Thus, the control circuit can be configured to allow the driver circuit 106 to drive the capacitive output load 112 for an amount of time relative to tau. This is particularly useful for applications that compensate for an introduced error because the charge or voltage on the load is a function of the steady-state charge and the amount of time the control circuit is configured, to allow the circuit 106 to drive towards the steady-state mode.

In another instance, the time delay of the control circuit 110 can be implemented without a direct relationship to the τ constant of the load. For example, the control circuit 110 can be implemented with a fixed time delay derived from a number of sources, such as clocks, circuit delays and external inputs. An external circuit can then compensate for an error using knowledge of the τ constant and the driver circuit 106.

In another instance, the time delay could be a function of the amount of current that is currently applied to the load. In one such instance, circuit 108 uses a bias current to drive the load towards the steady-state mode. As the load reaches the steady-state charge or voltage, the amount of bias current applied to the load is reduced. Thus, control circuit 110 can be configured to detect when the amount of bias current currently applied to the load reaches a certain level, and in response, significantly reduces the bias current through driver circuit 108.

In one embodiment of the present invention, the system of FIG. 1 is used in a switched-capacitor circuit. In another embodiment of the present invention the system of FIG. 1 is used in an ADC, such as a pipelined ADC or a cyclic ADC.

Figure 2:
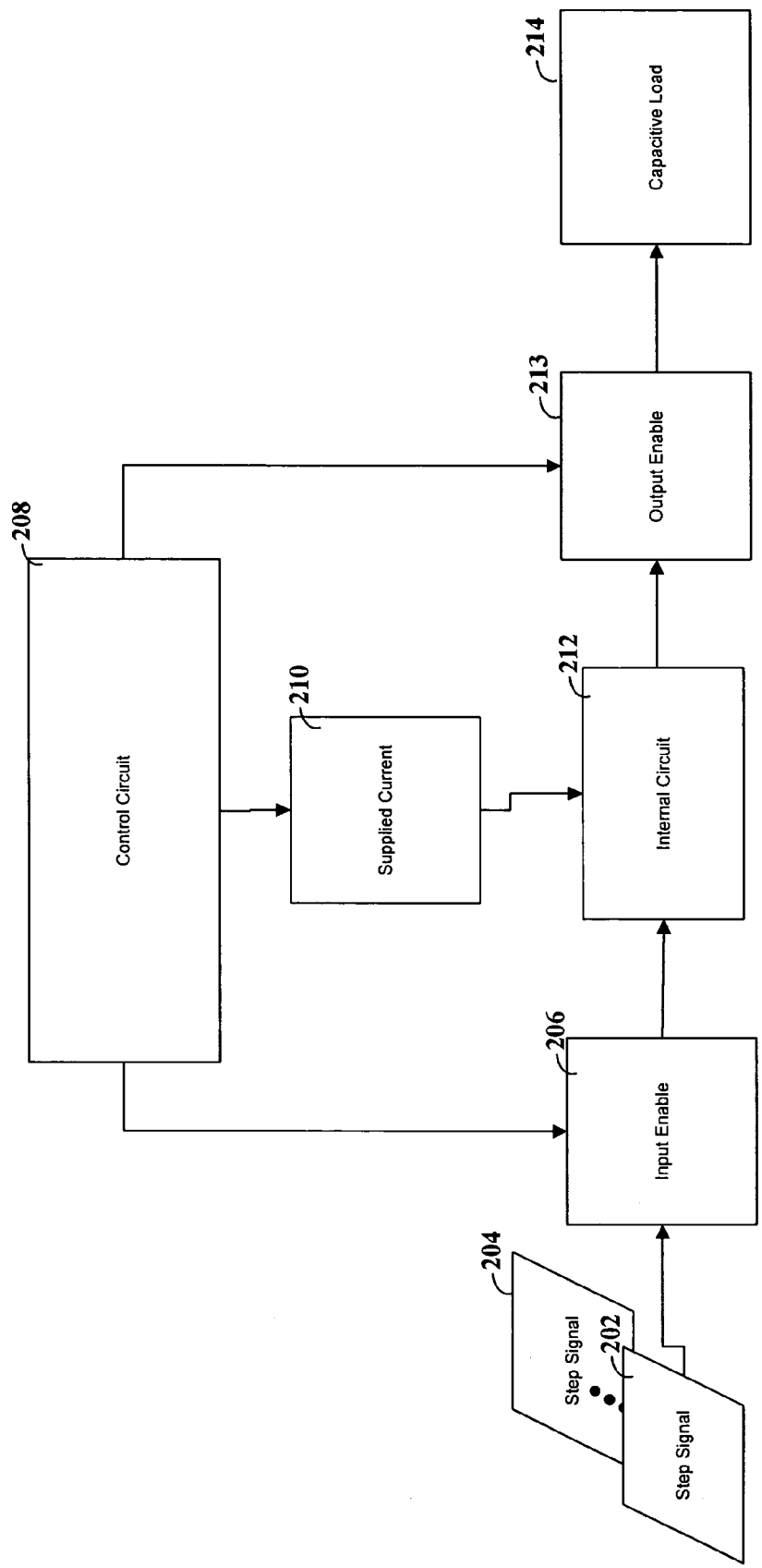
FIG. 2 shows a block diagram of a driver system, according to an example embodiment of the present invention.

FIG. 2 shows a block diagram of a driver system, according to an example embodiment of the present invention. Internal circuit 212 drives capacitive load 214 (using supplied current 210) towards steady-state modes that are responsive to step signals 202-204. Control circuit 208 inhibits the drive capabilities of internal circuit 212 before the steady-state modes are reached.

FIG. 2 shows control circuit 208 connected to three different blocks, input enable 206, supplied current 210 and output enable 213. Depending upon the circuit design, however, control circuit 208 can control the driving of capacitive load 214 using any one of the blocks, or combination thereof. For instance, some circuits have high impedance outputs that stop driving when the input signals are disabled or the supplied current to the driver circuit is reduced. In another instance, internal circuit 212 is inhibited by disabling the output, as shown by block 213. This can be accomplished using a number of methods, including isolation using gates or switches.

In one embodiment of the present invention, internal circuit 212 includes an amplifier circuit that operates by using current steering semiconductor gates. The amplifier circuit operates by selectively applying a bias current of the amplifier to create a voltage output that is responsive to the voltage at the input. Thus, when the input differential voltage is zero, the gates for steering the bias current steer the current such that the differential output is also zero. One such example circuit is shown by the open-loop amplifier circuit of FIG. 3.

Figure 3:
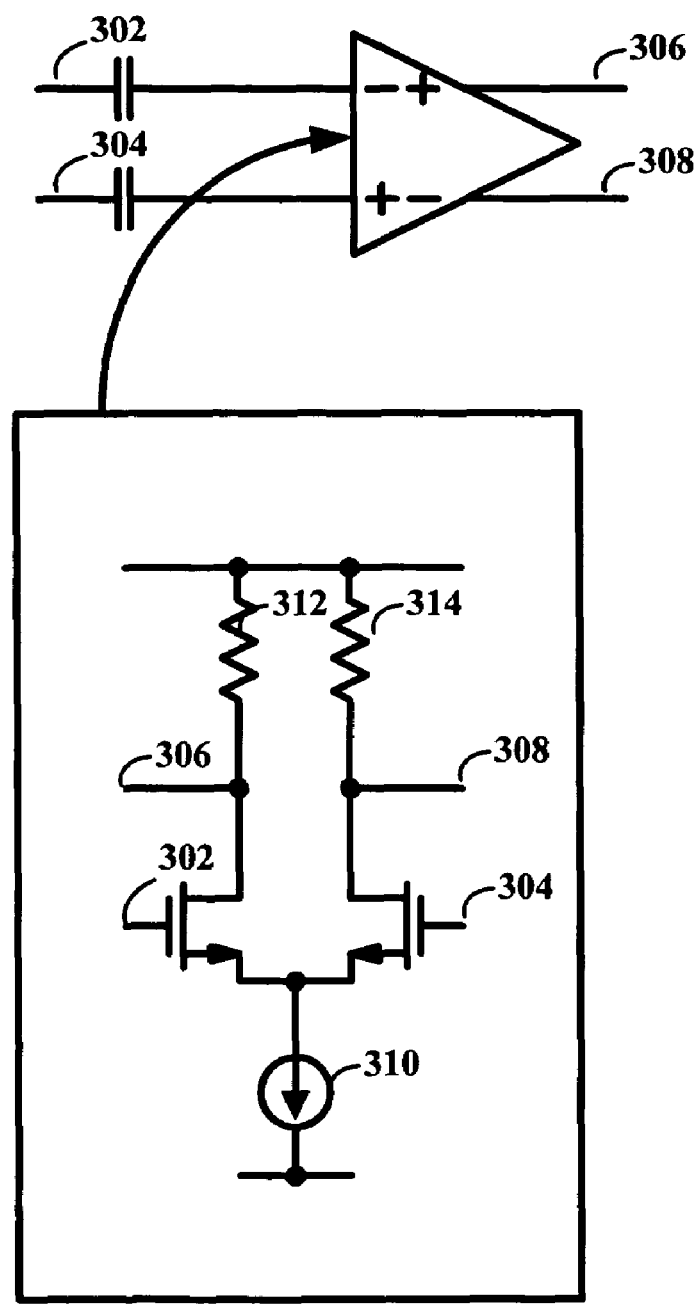
FIG. 3 shows a circuit diagram of an open-loop amplifier circuit, according to an example embodiment of the present invention.

FIG. 3 shows a circuit diagram of an open-loop amplifier circuit, according to an example embodiment of the present invention. The circuit of FIG. 3 shows inputs 302 and 304, outputs 306 and 308, and bias current 310. The semiconductor gates connected to inputs 302 and 304 distribute the bias current 310 between themselves relative to the inputs 302 and 304. This creates a corresponding steady-state voltage differential between outputs 306 and 308 due to the different voltage drops across resistors 312 and 314.

Figure 4:
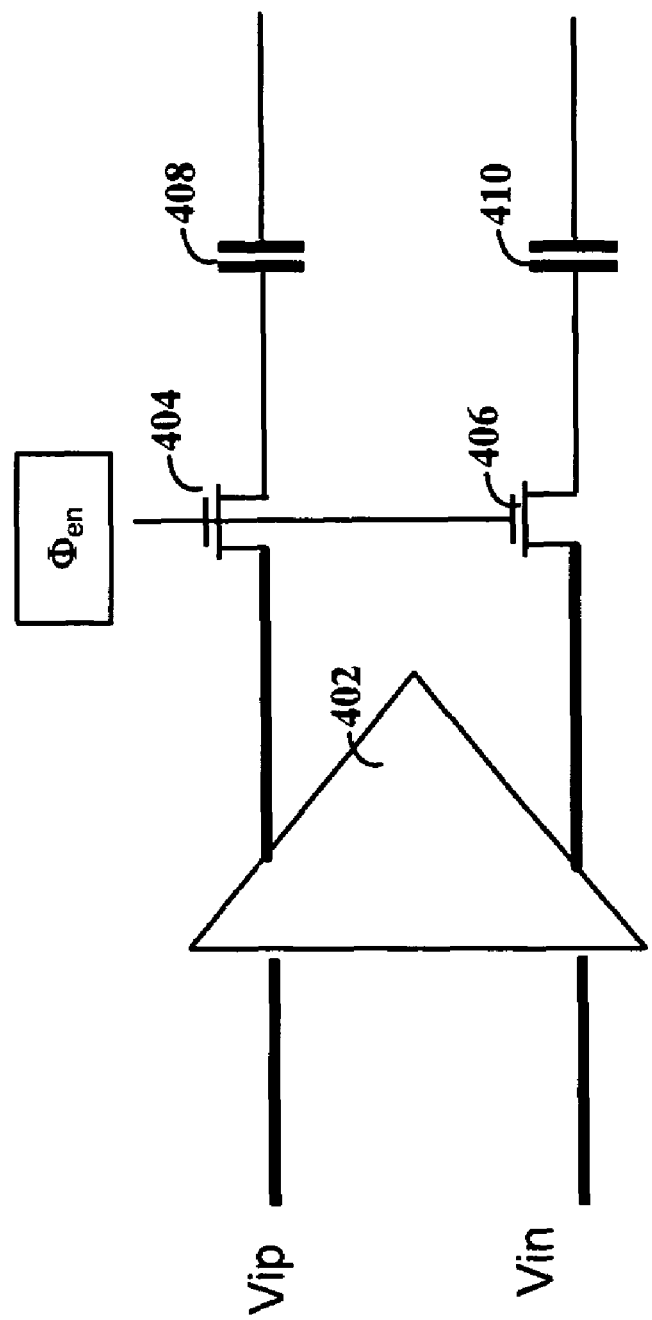
FIG. 4 shows a circuit diagram of a driver circuit, according to an example embodiment of the present invention.

FIG. 4 shows a circuit diagram of a driver circuit, according to an example embodiment of the present invention. The circuit of FIG. 4 shows step input signals Vip and Vin, which are connected to amplifier circuit 402. In response to the step input signals, amplifier circuit 402 drives loads 408 and 410 toward a steady-state mode. Control circuitry prevents the loads 408 and 410 from reaching a steady-state mode using the Φen signal, thereby isolating the output of amplifier circuit 402 from the loads using gates 404 and 406. One skilled in the art would recognize that variations of active and inactive states of the signals can be implemented. For instance, the Φen1 signal can be implemented as either an active high signal or an active low signal.

Figure 5:
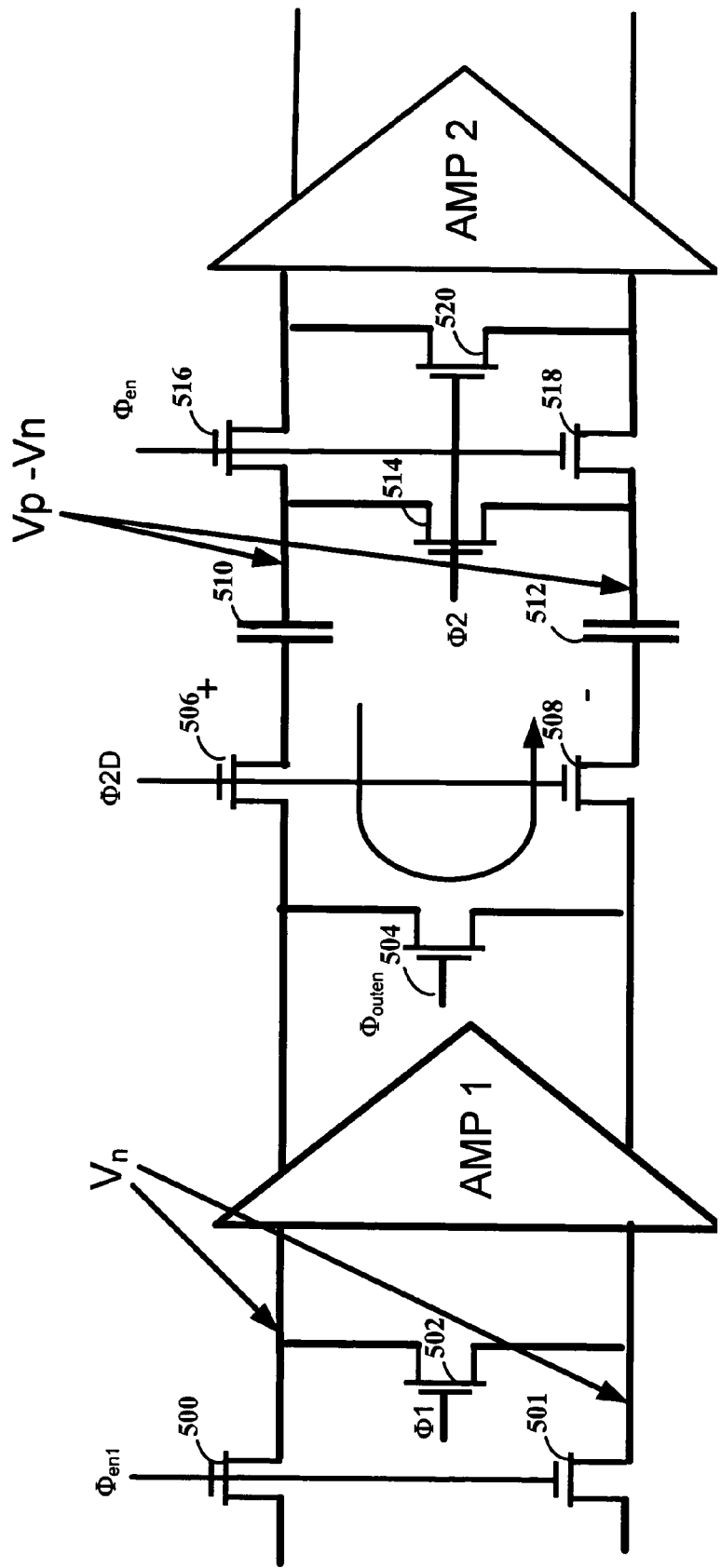
FIG. 5 shows a circuit diagram of a driver circuit having multiple stages, according to an example embodiment of the present invention.

FIG. 5 shows a circuit diagram of a driver circuit having multiple stages, according to an example embodiment of the present invention. Amplifier 1 and amplifier 2 (AMP 1 and AMP 2) represent different driver circuits from which the output of AMP 1 is an input to AMP 2. AMP 1 drives capacitors 510 and 512 towards a steady-state mode that is responsive to the inputs of the first stage. Gates 504 and 506 isolate the capacitors from the output of AMP 1 before reaching the steady-state mode. Once the resulting voltage differential between capacitors 510 and 512 is processed by AMP 2, the voltage differential is removed by enabling gate 504. This is particularly useful for driving the inputs of Stage 2 to a known state prior to AMP 1 driving the inputs towards a steady-state mode. This can be particularly useful for simplifying the process of determining the error introduced by not reaching the steady-state mode. For example, this configuration can be used to allow the amplifier to start at a known state for each step input and the step response can be approximated using an exponential RC response that is near ideal. This can also be particularly useful for reducing transient voltage spikes due to clock feed-through of the switch networks and residual charge from previous clock cycles.

Figure 5A:
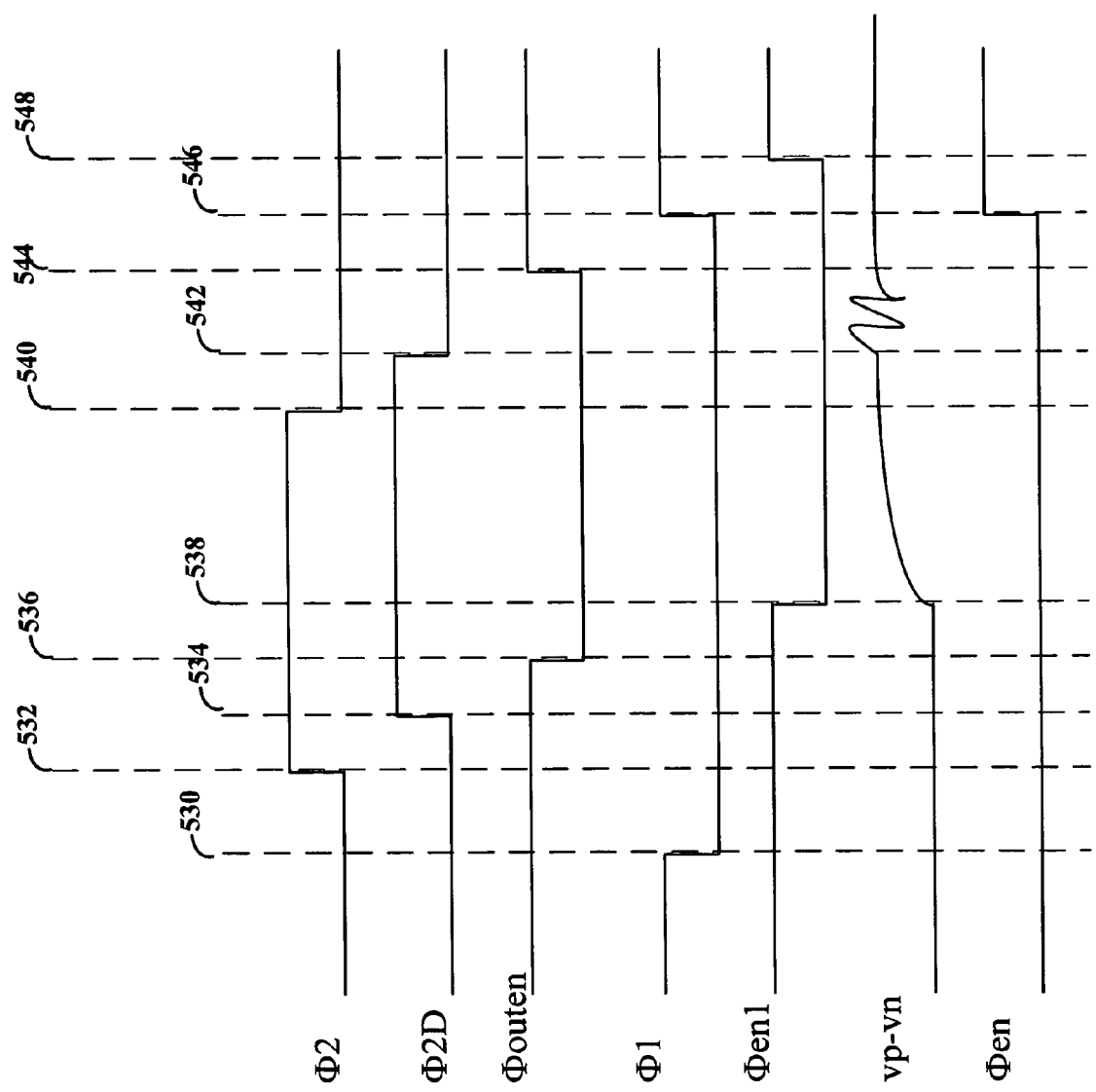
FIG. 5A shows a timing diagram of the gate enable signals of FIG. 5, according to an example embodiment of the present invention.

FIG. 5A shows a timing diagram of the gate enable signals of FIG. 5, according to an example embodiment of the present invention. At time 530 signal Φ1 disables gate 502, while gates 500, 501 are enabled. This allows input signals to reach AMP 1; however, because the Φ2D signal is inactive, gates 506 and 508 isolate the output of AMP 1 from capacitive loads 510 and 512. At time 532, the Φ2 signal activates gates 514 and 520, while the gates 516 and 518 remain inactive due to the Φen signal. Thus, gates 514 and 520 remove voltage differentials between the signal paths on either side of gates 516 and 518 (i.e., a voltage differential between capacitors 510 and 512, and a voltage differential between the inputs of AMP 2). At time 534, the Φ2D signal activates gates 506 and 508, thereby connecting the outputs of AMP 1 to capacitors 510 and 512; however, due to gate 504 remaining active, the capacitors are not yet driven to the steady-state mode. At time 536, the Φouten signal disables gate 504 and the AMP 1 begins driving capacitors 506 and 508 towards the steady-state mode that corresponds to the input signals. At time 538, the Φen1 signal disables gates 500 and 501, thereby isolating the inputs of AMP1. At time 540, the Φ2 signal disables gates 514 and 520, thereby isolating the signal paths on either side of gates 516 and 518 from each other. At time 542, the Φ2D signal disables gates 506 and 508, thereby preventing AMP 1 from driving capacitive loads 510 and 512 to the steady-state mode. In an ADC implementation, the charge stored on capacitors 510 and 512 can be modified in response to the ADC conversion of stage 1. Timing issues can cause transient voltage spikes to appear between the signal paths as shown by the signal diagram for vp-vn. These transient voltage spikes are isolated from AMP 2 while gates 516 and 518 are disabled. At time 544, the Φouten signal enables gate 504, thereby removing the voltage differential at the output of AMP 1. At time 546, the Φ1 signal enables gate 502, thereby removing the voltage differential at the input of AMP 1. Additionally, the Φen signal enables gates 516, thereby applying the signal from capacitors 510 and 512 to the input of AMP 2. At time 548, the Φen1 signal enables gates 500 and 501, thereby connecting the next step input signal to AMP 1.

Figures 6, 6A:
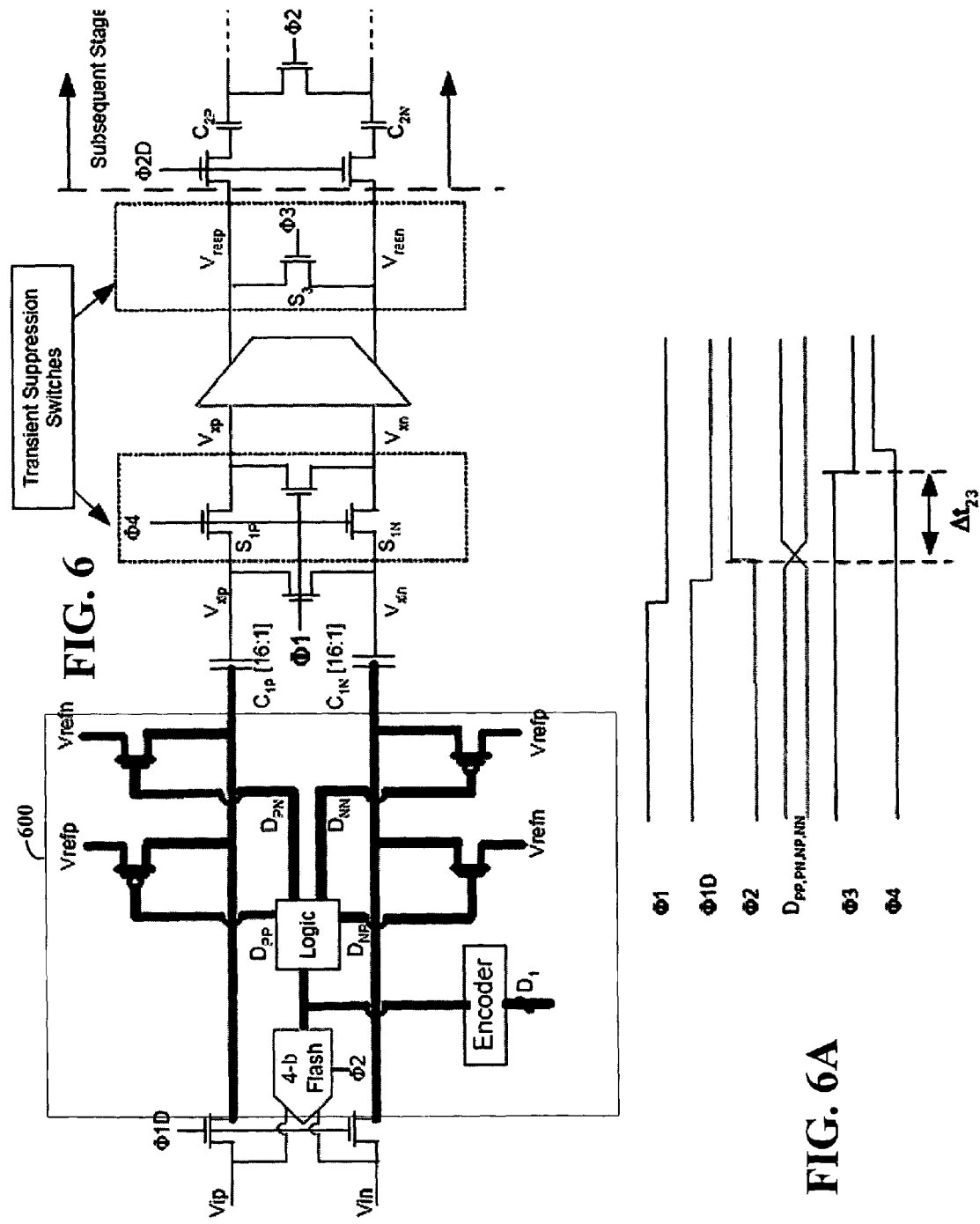
FIG. 6 shows a circuit diagram of a driver circuit for a pipelined or cyclic ADC, according to an example embodiment of the present invention.
FIG. 6A shows a timing diagram of various signals of FIG. 6, according to an example embodiment of the present invention.

FIG. 6 shows a circuit diagram of a driver circuit for one stage of an ADC, according to an example embodiment of the present invention. FIG. 6A shows a timing diagram of various signals of FIG. 6, according to an example embodiment of the present invention. Block 600 represents a schematic of an example ADC circuit used for either a pipeline or cyclic ADC system. The workings of block 600 would be understood by one skilled in the art and have been omitted for the sake of brevity.

Switches $S_{1P}$ and $S_{1N}$ prevent feed-through transients at $V_{xip}/V_{xin}$ from reaching the input of the open-loop gain stage. The switch $S_3$ removes charge resulting from previous clock cycles to facilitate a history-independent settling transient. The timing of these switches is controlled as follows. After the transients at $V_{xip}/V_{xin}$ have died out, the output is released via $S_3$ (Φ3 goes low) and the amplifier is connected to the input network through $S_{1P}$ and $S_{1N}$ (Φ4 goes high). A delay $\Delta t_{23}$ is chosen such that the sampling capacitors of succeeding stage, $C_{2P}$ and $C_{2N}$, are given enough time to remove any memory effects from previous samples by discharging the capacitors. The extra clock phases, Φ3 and Φ4, are generated from Φ1 using inverter delay chains.

Figure 7:
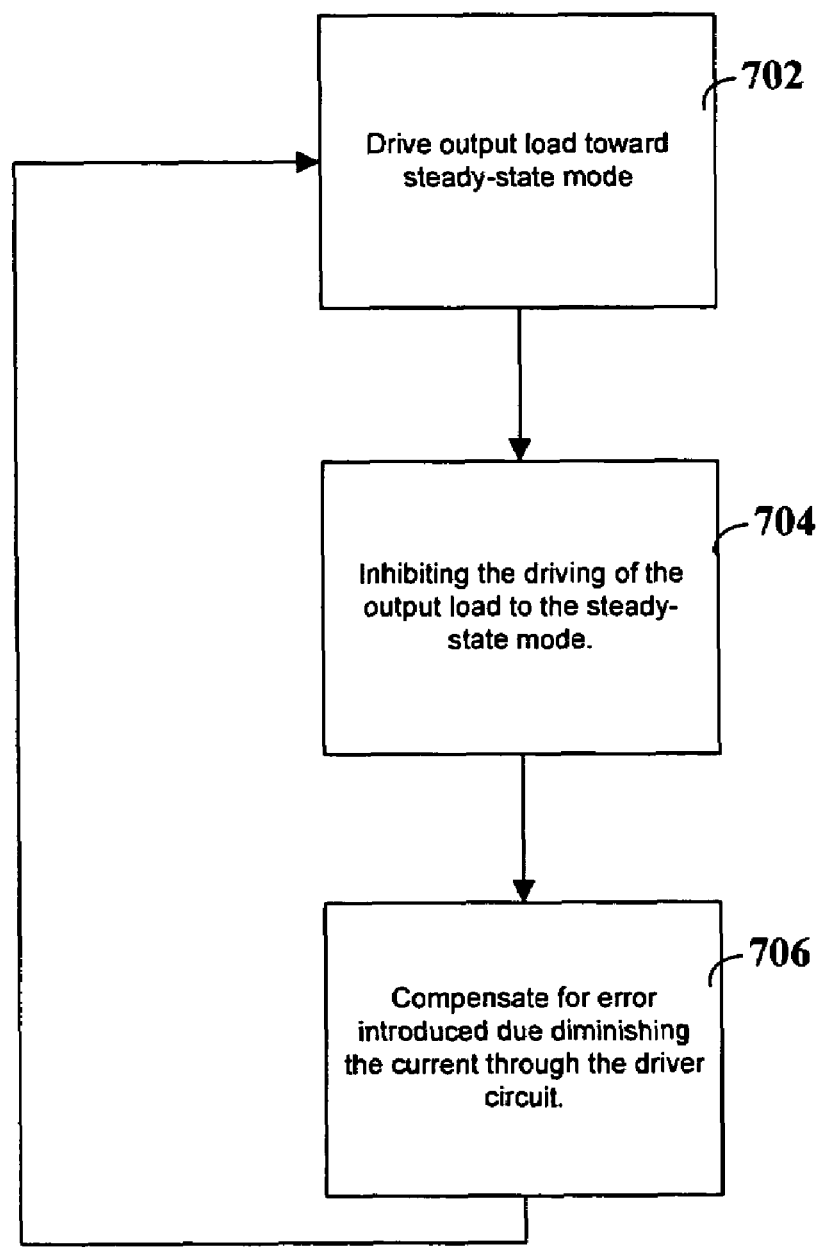
FIG. 7 shows a flow diagram of a method for driving a capacitive output load, according to an example embodiment of the present invention.

FIG. 7 shows a flow diagram of a method for driving a capacitive output load, according to an example embodiment of the present invention. At block 702, the output is driven toward a steady-state mode using a current through a driver circuit. The steady-state mode is responsive to a step input signal. According to a specific example of such a steady-state mode, the steady-state mode represents an amplified version of the step input signal. Before the output reaches the steady-state mode, the driver is inhibited from driving the capacitive load. In one instance, the reduction of current introduces an error relative to the steady state mode (e.g., the output load is not driven to the steady-state mode), as shown by block 704. Compensation for the error can be accomplished using logic circuitry as shown by block 706. The steps 702-706 can be repeated for additional step input signals as desired.

In another instance, the driver circuit can be configured to drive towards a steady-state mode that exceeds the desired output signal. For instance, the desired output signal could be defined by a gain factor G relative to the step input signal. The driver circuit can be configured to have a gain G+ that is greater than G, and thus, the driver circuit is configured to drive towards a steady-state mode that exceeds the desired steady-state mode. A control circuit then inhibits the driver circuit from driving to the G+ steady-state mode when the output load is at a signal level that corresponds to the G steady-state mode. This is particularly useful for increasing the power efficiency of amplifier circuits, as the efficiency of many amplifier circuits reduces as the amplifier circuit approaches the steady-state mode (e.g., the power transferred to the capacitive load is reduced relative to the internal current of the amplifier).

In one embodiment of the present invention, the step of compensating for the error can be accomplished using digital processing. For example, the voltage or charge at the output load can be converted into a digital signal and processed using logic that approximates the error relative to the steady-state mode.

In another embodiment of the present invention, the step input signals are isolated from the driver circuit prior to the driving the output load towards the steady-state mode. In a particular instance, the inputs to the driver circuit can also be driven towards a known voltage or charge (e.g., zero volts) while isolated.

The step of inhibiting the driver circuit can be accomplished using a number of different methods. In one instance, the current is diminished by controlling the input and/or outputs of the driver circuit. In another instance, the current is diminished by controlling the source of the current.

In one embodiment of the present invention, the time between driving towards consecutive steady-state modes can be reduced relative to a driver circuit that drives to the steady-state mode. In another embodiment of the present invention, the power dissipated between driving towards consecutive steady-state modes can be reduced relative to a driver circuit that drives to the steady-state mode.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, such changes may include different methods of significantly diminishing current draw through the driver circuit. Such modifications and changes do not depart from the true spirit and scope of the present invention, which is set forth in the following claims.

What is claimed is:

1. A switched-capacitor driver circuit for producing an output signal by driving a capacitive output load in response to step input signals, the driver circuit comprising:
   output circuitry that drives the capacitive output load toward a steady-state mode responsive to one of the step input signals, and
   control circuitry that prevents the capacitive output load from reaching the steady-state mode.

2. The circuit of claim 1, wherein the difference between the output signal and a signal corresponding to the steady-state mode represents an error that is compensated for digitally.

3. The circuit of claim 1, wherein the output circuitry is arranged such that a signal level corresponding to the steady-state mode includes an error relative to a desired output signal level.

4. The circuit of claim 3, wherein the output signal corresponds to the desired output signal due to the error.

5. The circuit of claim 1, wherein said one of the step input signals is isolated from the output circuitry prior to driving the capacitive output load toward the steady-state mode.

6. The circuit of claim 5, wherein, while said one of the step input signals is isolated, an input to the output circuitry is driven to a known charge or voltage.

7. The circuit of claim 1, wherein the output circuitry is an open-loop amplifier circuit.

8. The circuit of claim 7, wherein errors for nonlinearity and incomplete settling are simultaneously compensated for digitally.

9. The circuit of claim 8, wherein the time between consecutive step inputs is reduced relative to time necessary for the output circuitry to reach the steady-state mode.

10. The circuit of claim 7, wherein the driver circuit is part of an analog-to-digital-converter that further processes a charge or voltage carried on the capacitive output load.

11. The circuit of claim 10, wherein, between consecutive step inputs, the total power dissipated by the output circuitry is reduced relative to power dissipation necessary for the output circuitry to reach the steady-state mode.

12. The circuit of claim 1, wherein the driver circuit is part of a pipelined analog-to-digital-converter.

13. The circuit of claim 1, wherein the driver circuit is part of a cyclic analog-to-digital converter.

14. The circuit of claim 1, wherein the capacitive output load is isolated from the output circuitry prior to being driven toward the steady-state modes.

15. The circuit of claim 14, wherein, while the capacitive output load is isolated, the capacitive output load is driven to a known charge or voltage.

16. For use in a switched-capacitor circuit, a method for producing an output signal by driving a capacitive output load in response to step input signals, the method comprising:
   driving the capacitive output load toward a steady-state mode in response to one of the step input signals; and
   preventing the capacitive output load from reaching the steady-state mode.

17. The method of claim 16, wherein the difference between the output signal and a signal corresponding to the steady-state mode represents an error that is compensated for digitally.

18. The method of claim 16, wherein the output circuit is arranged such that output signal levels corresponding to the steady-state mode include errors relative to a desired output signals.

19. The method of claim 18, wherein the output signals corresponds to the desired output signals due to the error.

20. The method of claim 18, wherein said step input signal is isolated from output circuitry prior to driving the capacitive output load toward the steady-state mode.

21. The method of claim 20, wherein, while said step input signal is isolated, an input to the output circuitry is driven to a known charge or voltage.

22. The method of claim 21, wherein the step of driving the capacitive output load toward the steady-state mode output circuitry uses an open-loop amplifier circuit.

23. The method of claim 22, wherein errors for nonlinearity and incomplete settling are simultaneously compensated for digitally.

24. The method of claim 23, wherein the open-loop amplifier circuit is part of an analog-to-digital-converter that further processes a charge or voltage carried on the capacitive output load.

25. The method of claim 24, wherein, between consecutive step inputs, the total power dissipated by the open-loop amplifier circuit is reduced relative to power dissipation necessary to reach the steady-state mode.

26. The method of claim 22, wherein the time between consecutive step inputs is reduced relative to time necessary to reach the steady-state mode.

27. The method of claim 16, wherein the switched-capacitor circuit is used in a pipelined analog-to-digital-converter.

28. The method of claim 16, wherein the switched-capacitor circuit is used in a cyclic analog-to-digital converter.

29. The method of claim 16, further including the step of isolating the capacitive output load from a driver circuitry prior to driving toward the steady-state mode.

30. The method of claim 29, further including the step of driving the capacitive output load to a known charge or voltage while the capacitive output load is isolated.

31. A system for producing an output signal by driving a capacitive output load in response to step input signals, the system comprising:
   internal output circuitry means for driving the capacitive output load toward a steady-state mode in response to one of the step input signals; and
   internal control circuitry means for preventing the capacitive output load from reaching the steady-state mode.

32. For use in a stage of one of a cyclic and pipelined analog-to-digital converter, a driver circuit for producing an output signal by driving a capacitive output load in response to step input signals, the driver circuit comprising:
   output circuitry that drives the capacitive output load toward a steady-state mode responsive to one of the step input signals, and
   control circuitry that prevents the capacitive output load from reaching the steady-state mode.

33. The circuit of claim 32, wherein the difference between the output signal and a signal corresponding to the steady-state mode represents an error that is compensated for digitally.

34. The circuit of claim 32, wherein the output circuit is arranged such that an output signal level corresponding to the steady-state mode includes an error relative to a desired output signal level.

35. The circuit of claim 34, wherein the output signal corresponds to the desired output signal due to the error.

36. The circuit of claim 35, wherein, while said one of the step input signals is isolated, the step input signal is adjusted in response to a digital-to-analog conversion of a digital signal from a previous stage of the analog-to-digital converter.

37. The circuit of claim 32, wherein said one of the step input signals is isolated from the output circuitry prior to driving the capacitive output load toward the steady-state mode.

38. The circuit of claim 37, wherein, while said one of the step input signals is isolated, an input to the output circuitry is driven to a known charge or voltage.

39. The circuit of claim 32, wherein the output circuitry is an open-loop amplifier circuit.

40. The circuit of claim 39, wherein errors for nonlinearity and incomplete settling are simultaneously compensated for digitally.

41. The circuit of claim 32, wherein, between consecutive step inputs, the total power dissipated by output circuit is reduced relative to power dissipation necessary for the output circuitry to reach the steady-state mode.

42. The circuit of claim 32, wherein the time between consecutive step inputs is reduced relative to time necessary for the output circuitry to reach the steady-state mode.

43. The circuit of claim 32, wherein the capacitive output load is isolated from the output circuitry prior to being driven toward the steady-state modes.

44. The circuit of claim 43, wherein, while the capacitive output load is isolated, the capacitive output load is driven to a known charge or voltage.

* * * * *